(12) United States Patent
Hanneman et al.

(10) Patent No.: US 8,073,413 B2
(45) Date of Patent: Dec. 6, 2011

(54) SYSTEMS AND METHODS FOR RECEIVING AND PROCESSING MULTIPLE CARRIER COMMUNICATIONS AND NAVIGATION SIGNALS

(75) Inventors: Charles Keith Hanneman, Olathe, KS (US); Jeffrey K. Hunter, Olathe, KS (US); Thomas E. Miller, Lawrence, KS (US); Joshua Delgado, Olathe, KS (US)

(73) Assignee: Honeywell International Inc., Morristown, NJ (US)

( * ) Notice: Subject to any disclaimer, the term of this patent is extended or adjusted under 35 U.S.C. 154(b) by 403 days.

(21) Appl. No.: 12/404,952

(22) Filed: Mar. 16, 2009

(65) Prior Publication Data
US 2010/0233985 A1 Sep. 16, 2010

(51) Int. Cl.
*H04B 1/16* (2006.01)
*H04B 1/18* (2006.01)
(52) U.S. Cl. .................... 455/179.1; 455/150.1
(58) Field of Classification Search .............. 455/150.1, 455/179.1, 180.1, 188.1, 191.1, 191.2, 191.3
See application file for complete search history.

(56) References Cited

U.S. PATENT DOCUMENTS

| | | | |
|---|---|---|---|
| 3,525,979 | A | 8/1970 | Kunkel et al. |
| 6,121,354 | A | 9/2000 | Chronister |
| 6,366,621 | B1 | 4/2002 | Kuntz et al. |
| 7,274,326 | B2 | 9/2007 | Gibson et al. |
| 2011/0096915 | A1* | 4/2011 | Nemer ........................ 379/158 |

OTHER PUBLICATIONS

"Aeronautical Telecommunications", "Annex 10-Aeronautical Telecommunications", pp. 1 7, 14, vol. 1, Publisher: ICAO International Standards and Recommended Practices.
E. Haas, H. Lang and M. Schnell, "Development and Implementation of an Advanced Airport Data Link Based on Multi-Carrier Communications", "European Transactions on Telecommunications: 3rd Special Issue on Multi-Carrier-Spread-Spectrum", Sep./Oct. 2002, vol. 13, No. 5.
"Part II—Voice Communication Systems", Publisher: ICAO International Standards and Recommended Practices Annex 10, Jul. 11, 1996, pp. 339-340, vol. III, No. 71.
"KY 196B VHF Communications Tranceiver", "Installation Manual", Jan. 1, 2000, Publisher: Honeywell International, Inc.
"KY196B VHF Communications Transceiver", "Maintenance Manual", May 1, 1999, Publisher: Honeywell International, Inc.
"Aeronautical Mobile Service", "Aeronautical Telecommunications", Jul. 11, 1996, pp. 340 and 429, vol. III, Publisher: International Civil Aviation Organization.
"Radio Navigation Aids", "Aeronautical Telecommunications Annex 10 to the Convention on Internation Civil Aviation", Jul. 14, 2006, pp. 1-588, vol. 1, No. 6, Publisher: International Civil Aviation Organization.

* cited by examiner

*Primary Examiner* — David Mis
(74) *Attorney, Agent, or Firm* — Fogg & Powers LLC

(57) ABSTRACT

Methods and systems for signal analysis in multiple radio carrier environments are provided. In one embodiment, a radio receiver comprises: an adaptive pass band filter that operates over a pass band of frequencies, the adaptive pass band filter subdividing the pass band into a plurality of sub-channels each comprising a narrower bandwidth than the pass band; and a signal analyzer receiving the plurality of sub-channels, the signal analyzer providing feedback to the adaptive pass band filter, wherein the adaptive pass band filter divides the pass band into the plurality of sub-channels based on the feedback; wherein the signal analyzer selectively generates an output comprising of at least one of the plurality of sub-channels.

20 Claims, 5 Drawing Sheets

SYSTEMS AND METHODS FOR RECEIVING AND PROCESSING MULTIPLE CARRIER COMMUNICATIONS AND NAVIGATION SIGNALS

BACKGROUND

In certain regions aircraft and ground stations communicate over VHF radio using what is commonly known as a "multi-carrier technique." That is, multiple ground transmitters, each transmitting the same voice signal over a separate carrier, are positioned throughout a geographic area. Typically the transmitters are separated by a distance of 50 to 100 miles and transmit on carrier frequencies which are individually offset from the channel's nominal frequency by offsets such as +/−5 kHz or +/−7.5 kHz. Additional information regarding the details of VHF multi-carrier communication can be found in ICAO Annex 10 Volume III, dated July 1995 with Amendment 71, dated 7 Nov. 1996 (herein incorporated in its entirety by reference).

So that a pilot is not continuously exposed to static noise in the absence of active transmissions, the aircraft's VHF radio implements a noise-based squelch. Within the intermediate frequency (IF) section of the radio, the noise-based squelch listens for noise in a frequency band slightly offset from the nominal frequency (i.e., the information bandwidth) of the selected channel. The frequency band monitored for noise normally does not contain transmitted intelligence. In radios which incorporate a detector this same technique described for the IF can be applied after the detector by monitoring noise at audio frequency. When not receiving a signal within the channel, IF noise is generated within the radio that can be observed within this band. When the noise-based squelch observes this noise and determines that the noise is above a pre-define level, the squelch is applied to suppress the output of audio to the pilot. When a VHF radio signal is received, the noise level within the observed band is reduced. This reduction of the IF noise indicates reception of a radio signal which, if it is reduced below a predetermined level, triggers the noise-based squelch to allow audio output to the pilot.

A problem occurs, however, when using the noise-based squelch in multi-carrier regions. Reception of multiple VHF radio voice signals within the radio's pass band will cause beat-frequency tones to appear within the frequency band observed by the VHF radio's noise-based squelch. Under these conditions, the VHF radio's noise-based squelch will "see" the beat-frequency tones and misinterpret them as a high level of noise and continue to apply the squelch to the audio output. The beat frequency's appearance in place of the noise effectively "locks" the squelch for the duration of the multi-carrier transmission, preventing the pilot from receiving voice information from the VHF radio. One technique for mitigating this effect is to fall back to automatic gain control (AGC) based squelch in multi-carrier regions. However, an AGC-based squelch provides less inherent ability than the noise-based squelch to distinguish the presence of a valid signal from noise. If the AGC-based squelch is adjusted to provide the same sensitivity as the noise-based squelch then there is a possibility that the AGC-based squelch will provide false squelch openings, which cause static noise to reach the pilot and contributes to pilot distraction. To prevent this, the AGC-based squelch is typically set to a much lower sensitivity than the noise-based squelch.

For the reasons stated above and for other reasons stated below which will become apparent to those skilled in the art upon reading and understanding the specification there is a need in the art for improved methods and systems for signal analysis in multiple radio carrier environments.

SUMMARY

The Embodiments of the present invention provide improved methods and systems for signal analysis in multiple radio carrier environments and will be understood by reading and studying the following specification.

Methods and systems for signal analysis in multiple radio carrier environments are provided. In one embodiment, a radio receiver comprises: an adaptive pass band filter that operates over a pass band of frequencies, the adaptive pass band filter subdividing the pass band into a plurality of sub-channels each comprising a narrower bandwidth than the pass band; and a signal analyzer receiving the plurality of sub-channels, the signal analyzer providing feedback to the adaptive pass band filter, wherein the adaptive pass band filter divides the pass band into the plurality of sub-channels based on the feedback; wherein the signal analyzer selectively generates an output comprising of at least one of the plurality of sub-channels.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Multi-Carrier VHF Voice Communications

Figure 1:
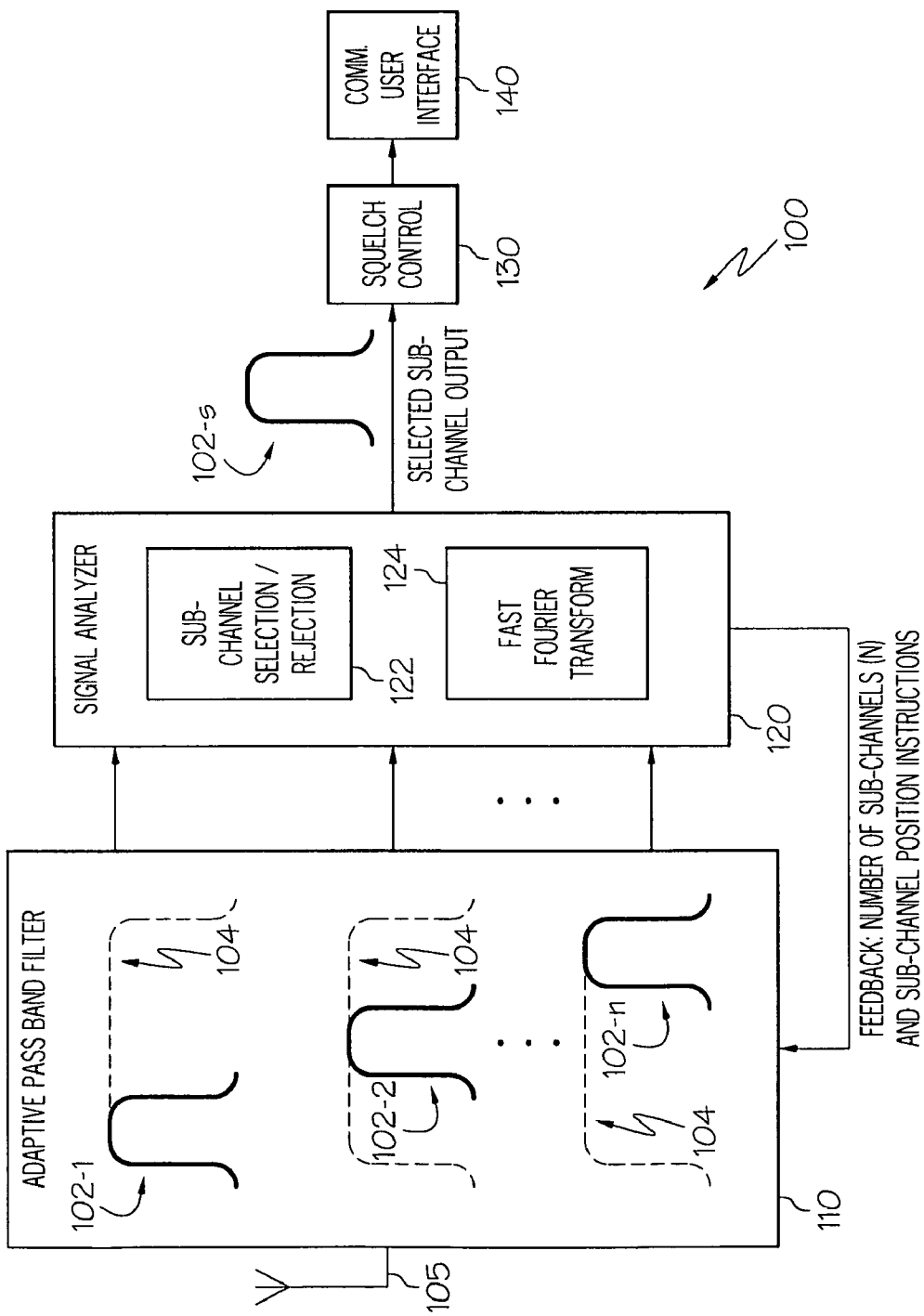
FIG. 1 is a block diagram illustrating a VHF communications radio of one embodiment of the present invention.

FIG. 1 is a simplified block diagram illustrating adaptive band pass filtering for a VHF radio 100 of one embodiment of the present invention. Radio 100 includes an antenna 105 for receiving radio signals, an adaptive band pass filter 110 coupled to the antenna 105, a signal analyzer 120 providing feedback to the adaptive pass band filter 110, a squelch control 130 that operates based on the output of the signal analyzer 120 and a communication user interface 140 for providing audio output to a pilot or other user. In one embodiment, VHF radio 100 further comprises those elements and functions standard for realizing VHF radio communications, such as, for example, described in Honeywell Installation Manual, No. 006-10570-0001, Rev. 1 (dated January 2000) for the KY 196B VHF Communications Transceiver, and in Honeywell Maintenance Manual, No. 006-15570-001, Rev. 1 (dated May 1999) for the KY 196B VHF Communications Transceiver, both of which are herein incorporated by reference in their entirety.

As illustrated in FIG. 1, adaptive pass band filter 110 operates over a pass band of frequencies (illustrated by 104). The particular range of frequencies included within the pass band 104 of radio 100 is selectable, based on the particular VHF radio channel selected by the user. Adaptive pass band filter 110 subdivides the pass band 104 into a plurality of sub-channels (102-1 to 102-$n$) each comprising a narrower bandwidth than pass band 104. Each of the sub-channels 102-1 to 102-$n$ are provided to signal analyzer 120 which determines whether multiple carrier signals are being received within pass band 104. If so, detection of the multiple carriers would indicate that radio 100 was operating within a multi-carrier region.

When multiple carriers are detected, signal analyzer 120 further comprises a sub-channel selection/rejection function 122 that identifies which sub-channel of the sub-channels 102-1 to 102-$n$ contains the strongest signal and selects that sub-channel (shown as 102-$s$) for output to squelch control 130. Weaker carriers within the other sub-channels are not passed. Because the sub-channel 102-$s$ passed to squelch control 130 includes only a narrow band (less than the full channel bandwidth of 104) having a single carrier signal, generation of beat frequency tones within the offset band observed by squelch control 130 is avoided. Thus when squelch control 130 listens for an attenuation of IF noise that occurs during reception of a valid VHF signal, the attenuation will not be masked by a beat frequency tone. Instead, squelch control 130 will recognize the attenuation of the IF noise and release the squelch to provide the sub-channel 102-$s$ to communication user interface 140. Communication user interface 140 in turn generates an audible voice signal for the pilot (or other user) based on the carrier signal in sub-channel 102-$s$. In one embodiment, in case two carriers are detected that are relatively equal in strength, signal analyzer 120 includes a hysteresis feature to prevent repeated flip-flopping between sub-channels. For example, in one embodiment, signal analyzer 120 waits for a pre-determined time period or pre-established differential signal level before switching from a currently selected sub-channel to a newly identified stronger sub-channel.

In an alternate embodiment, rather than squelch control 130 operating as a noise-based squelch, an indication from signal analyzer 120 that there are carriers present within pass band 104 is sufficient to cause squelch control 130 to release the squelch and allow the signal from the selected sub-channel 102-$s$ to proceed to the communication user interface 104.

The number and bandwidth of sub-channels 102-1 to 102-$n$ into which pass band 104 is divided, as well as the position of the sub-channels 102-1 to 102-$n$ within pass band 104, is determined by signal analyzer 120. In one embodiment, signal analyzer 120 applies a Fast Fourier Transform (FFT) 124 to identify the number of, and location of, carriers within pass band 104. With this information, signal analyzer 120 instructs adaptive pass band filer 110 to subdivide pass band 104 into a number of sub-channels equal to the number of detected carriers. For example, in one embodiment where signal analyzer 120 identifies three (3) carrier signals at frequencies f1, f2 and f3 within pass band 104, it will instruct adaptive pass band filter 110 to sub-divide pass band 104 into three sub-channels, each centered at f1, f2 and f3, respectively. Each of the sub-channels will have a sufficient bandwidth to include its respective carrier and any information modulated thereon, but will have a narrow enough bandwidth to exclude pollution from signals in a neighboring sub-channel.

Figure 2:
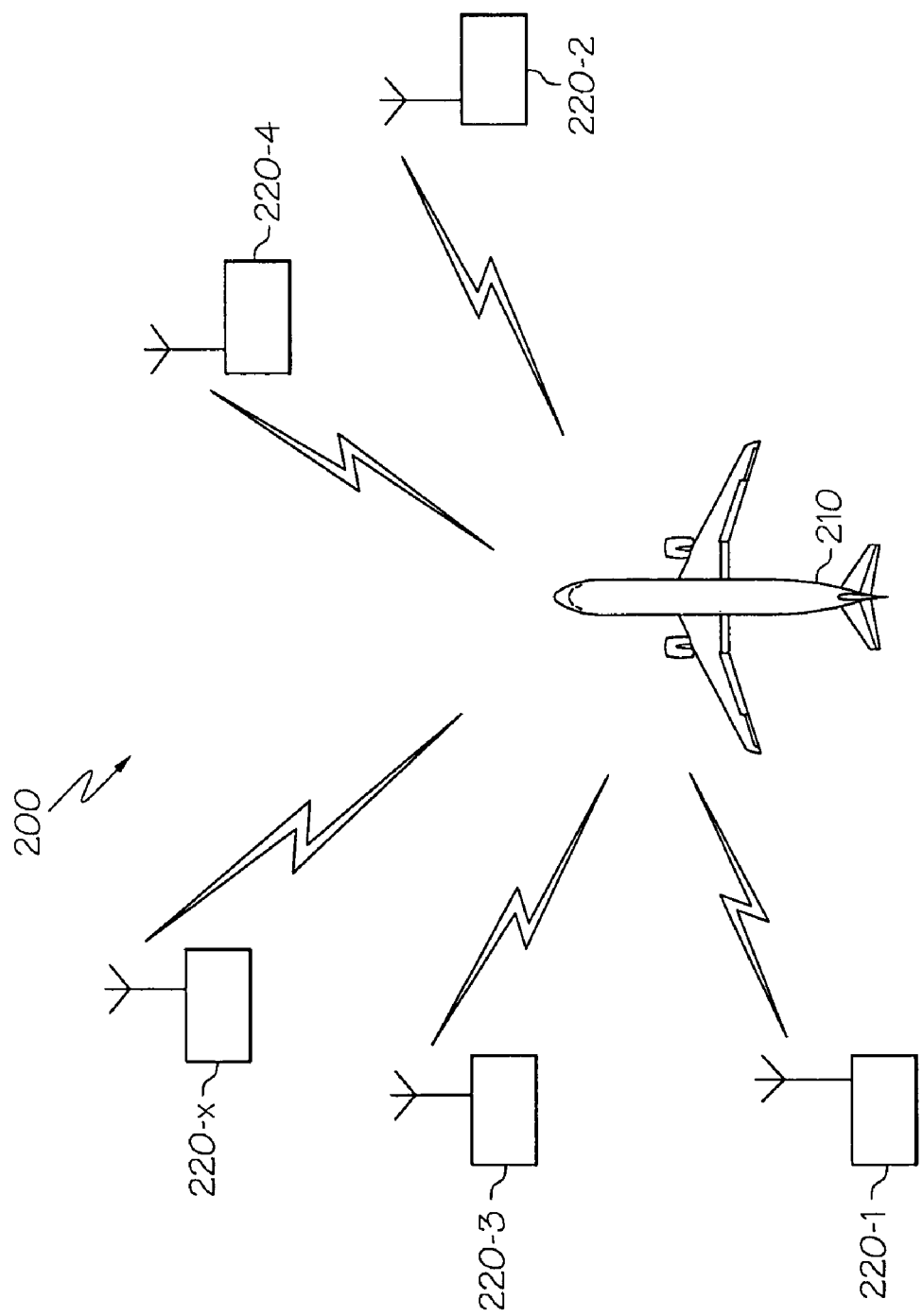
FIG. 2 illustrates an aircraft having a VHF communications radio of one embodiment of the present invention flying in a multicarrier voice communications region.

FIG. 2 illustrates one example of an embodiment of the present invention, with an aircraft 210 flying in a region 200 covered by multiple VHF radio transmitters 220-1 to 220-$x$. Aircraft 210 is equipped with a VHF radio such as radio 100 described with respect to FIG. 1. In operation, as aircraft 210 enters region 200, the signal analyzer will detect carrier transmissions from any or all of the transmitters 220-1 to 220-$x$ that are transmitting within the pass band to which the radio is tuned. Assuming that VHF radio transmitters 220-1, 220-2 and 220-3 are transmitting within that pass-band and are within range, the radio's signal analyzer will identify the presence of the three carriers and based on this information, the adaptive pass band filter will sub-divide the pass band into three sub-channels corresponding to the three carriers. The signal analyzer will identify which of the sub-bands includes the strongest carrier and pass that sub-channel to radio squelch control. As aircraft 200 continues to travel through region 200, signal analyzer will continue to determine which of the sub-channels has the strongest carrier, and will also analyze for the appearance of new carriers from newly in-range transmitters (as well as the disappearance of existing carriers for now out out-of-range transmitters) to dynamically adjust the number and location of sub-channels implemented by the adaptive pass band filter.

Multi-Carrier Navigation

Airport radio guidance and navigation systems (such as, but not limited to an Instrument Landing System (ILS)) also provide examples of multi-carrier applications within the scope of embodiments of the present invention. Dual carrier ILS glide slope and localizer systems are examples of two such applications. Radio beams are detected by equipment onboard the aircraft and provides lateral, along-course, and vertical guidance to aircraft attempting to land at an ILS equipped airport. The localizer signal includes radial information for a single course, the runway heading. The glide slope signal is the signal that provides vertical guidance to the aircraft during an ILS approach. A standard glide-slope path is approximately 3° downhill to the approach-end of the runway.

Figure 4:
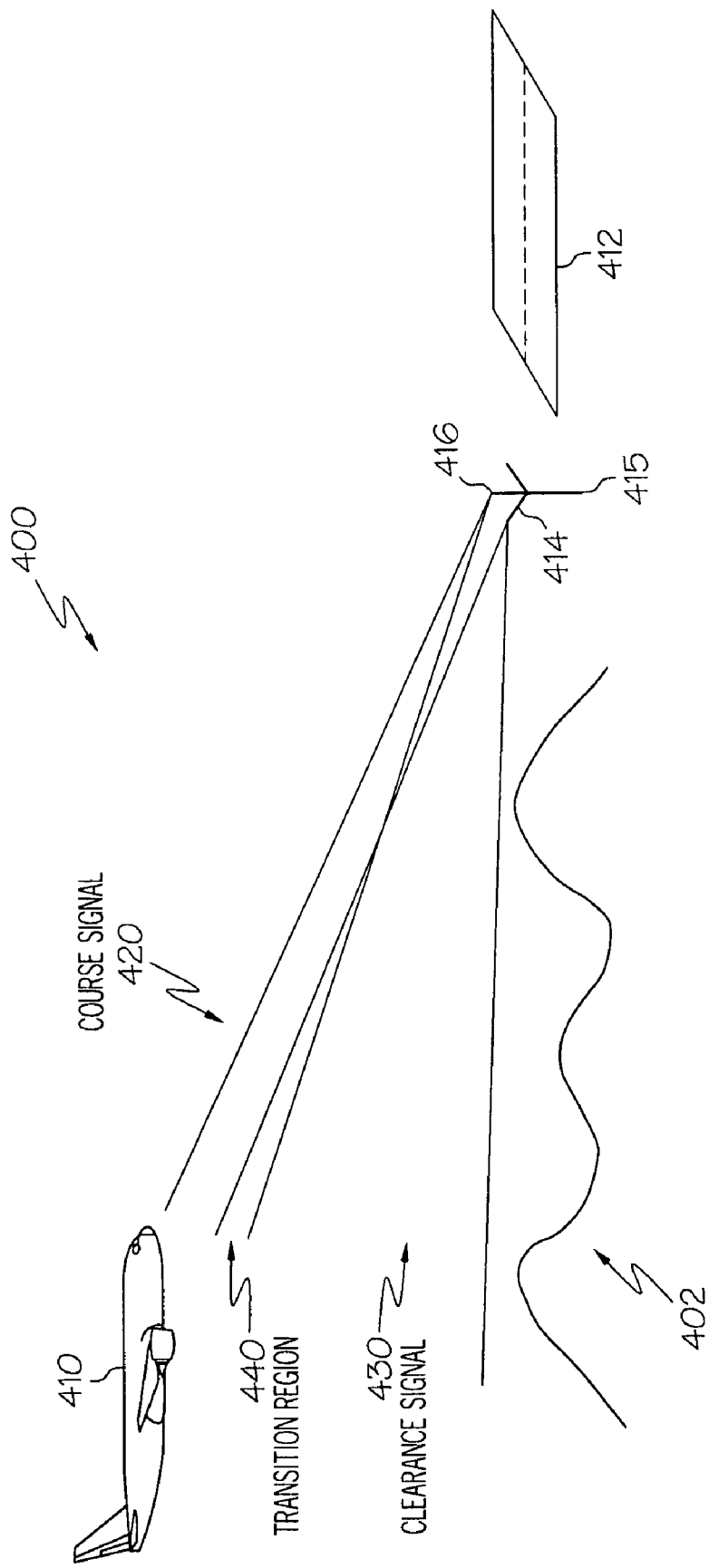
FIG. 4 illustrates an aircraft having a navigational radio of one embodiment of the present invention flying in an area with multicarrier navigation signals.

FIG. 4 illustrates an application of one embodiment of the present invention of a dual carrier glide slope ILS installation (shown generally at 400) for an airport runway 412 with a hilly surrounding terrain (shown generally at 402).

A first carrier from a first transmitter 416 provides a course signal 420 formed into a beam guiding an aircraft 410 for it's descent to the runway 412. A second carrier from a second transmitter 414 provides a clearance signal 430 that guides the aircraft 410 up away from the terrain 402. As shown in FIG. 4, the course signal 420 and clearance signal 430 from respective transmitters 416 and 414 are typically transmitted via two respective antennas co-located on a common antenna tower 415 The course signal 420 is formed by signal additions and cancellations from the transmitter 416 and forms the desired glide slope path with respect to the runway 412. In situations where there is rising hilly terrain, the clearance signal 430 floods the area below the course signal with a transmission that tells the aircraft 410 to increase altitude.

Thus, in one example, as aircraft 410 flies towards runway 412 it first encounters the clearance signal 430 which instructs the pilot to increase altitude until it enters the region containing the course signal 420. Between the course signal 420 region and the clearance signal 430 region is a transition region 440. Normally, when an aircraft is flying in the course signal 420 region, the power level of the clearance signal 430 should be at least 26 dB below the course signal 420. However, travel through the transition region 440, or alternately, degradations in radio equipment or environmental conditions, can allow the clearance signal 430 to interfere with a pilot's attempt to follow the course signal 420 (for example, by causing the navigation system to provide a pilot with false fly up directions).

Embodiments of the present invention provide improved systems and methods for identifying and selecting a course signal from a clearance signal as an aircraft transitions from a clearance signal region to a course signal region and improves the pilot's ability to follow the course signal during aircraft decent to a runway.

Figure 3:
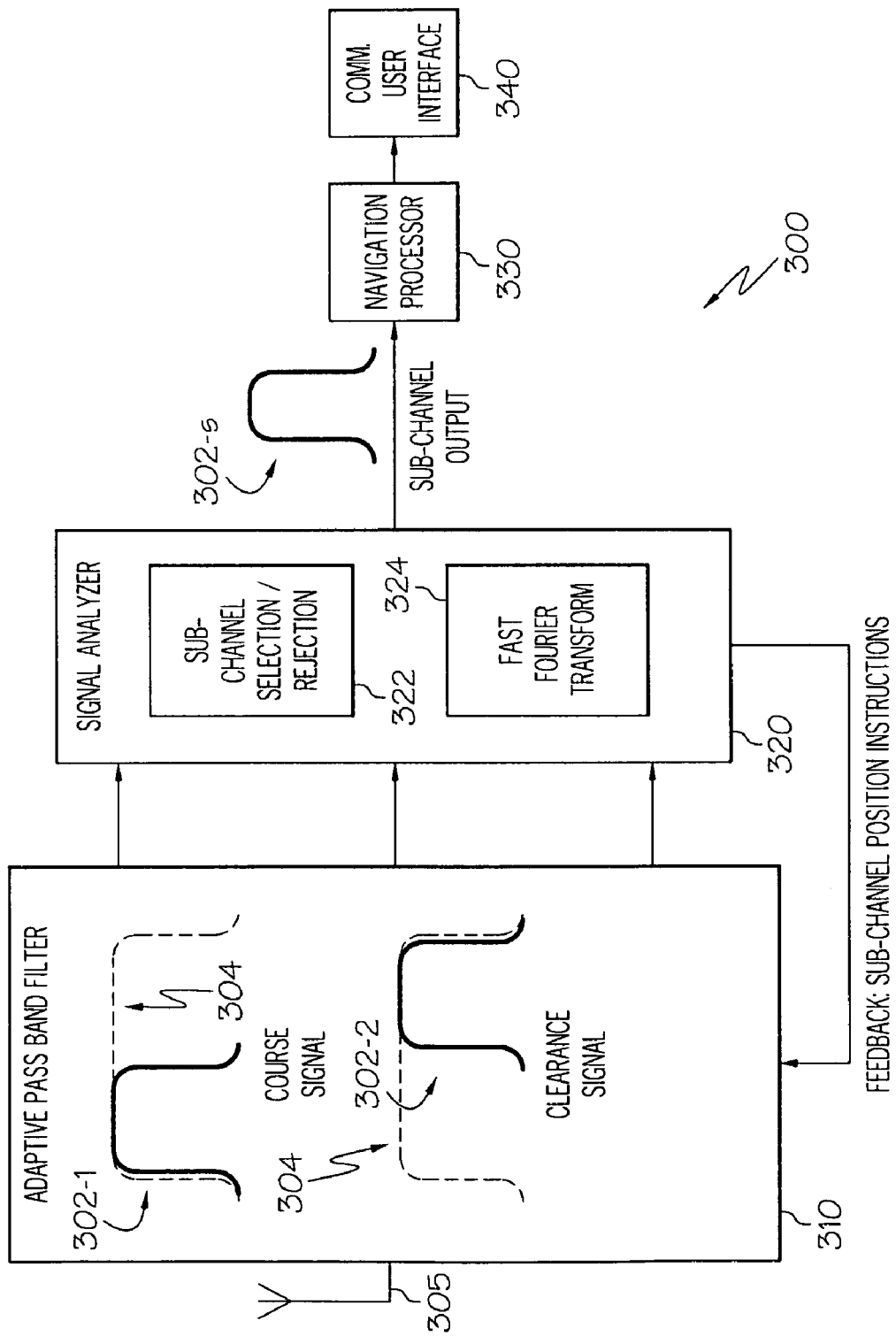
FIG. 3 is a block diagram illustrating a navigation radio of one embodiment of the present invention.

FIG. 3 is a block diagram illustrating navigation system radio 300 of one embodiment of the present invention. Radio 300 includes an antenna 305 for receiving radio navigation signals (such as ILS radio signals), an adaptive band pass filter 310 coupled to the antenna 305, a signal analyzer 320 providing feedback to the adaptive pass band filter 310, a navigation processor 330 for processing course and clearance signals into a signal representing navigation information, and a communication user interface 340 for providing navigation guidance to a pilot based on the output of the navigation processor 330. In one embodiment, navigation processor 330 further processes localizer signals into radial navigation information. Although the example discussed with respect to FIG. 3 is focused on dual carrier glide slope, one of ordinary skill in the art upon reading this specification would appreciate that the disclosure provided herein equally applies to dual carrier localizer signals. In one embodiment, radio 300 further comprises those elements and functions standard for realizing a radio navigation receiver.

As illustrated in FIG. 3, adaptive pass band filter 310 operates over a pass band of frequencies (illustrated by 304). The particular range of frequencies included within the pass band 304 of radio 300 is selectable, based on the particular signal channel (for example, ILS radio channel) selected by the user. Adaptive pass band filter 310 subdivides the pass band 304 into a plurality of sub-channels (302-1 to 302-2) each comprising a narrower bandwidth than pass band 304. Each of the sub-channels 302-1 to 302-2 are provided to signal analyzer 320 which confirms whether multiple carrier signal are being received within pass band 304. In a dual carrier glide slope application, only two carriers at most would normally be expected to appear within the pass band 304 (i.e., a course signal carrier and a clearance signal carrier). However, in one embodiment, should more that two carriers appear adaptive pass band filter 310 subdivides the pass band 304 into sub-channels for each carrier and signal analyzer 320 determines which sub-channels include the correct course signal and/or clearance signal to pass to navigation processor 330.

In one embodiment, signal analyzer 320 applies a Fast Fourier Transform (FFT) 324 to identify the number of, and location of, carriers within pass band 304. In other embodiments, this information may be obtained by signal analyzer 320 through other frequency analysis algorithms, or through means such as a bank of band pass filters. With this information, signal analyzer 320 instructs adaptive pass band filer 310 how to subdivide pass band 304 into sub-channels. For example, in one embodiment where signal analyzer 320 identifies carrier signals at frequencies f1 and f2 within pass band 304, it will instruct adaptive pass band filter 310 to sub-divide pass band 304 into two sub-channels, each centered at f1 and f2, respectively. Each of the sub-channels will have a sufficient bandwidth to include its respective carrier and any information modulated thereon, but narrow enough to exclude pollution from signals in a neighboring sub-channel. In addition, for circumstances where course signal and clearance signal carrier frequencies are published or otherwise regulated, radio 300 may be programmed to know a priori which of the sub-channels should be expected to contain a course signal, and which sub-channel should be expected to contain a clearance signal.

In operation, as an aircraft flies into the course signal beam it will often traverse a transition region where the course and clearance signals are approximately equal in strength. As the aircraft continues to enter the course signal region, it will reach a point where the clearance signal is significantly smaller than the course signal and the course signal dominates the generation of navigation information by navigation processor 330. Irregularities in radio operation the terrain surrounding an airport can manifest themselves as a ripple in the clearance signal that will cause an offset in the navigation guidance (i.e., the glide slope indication) provided to a pilot. One scenario where this may occur with when there is significant multi-path of the clearance signal into the course area. Embodiments of the present invention allow for the detection of such anomalies and mitigate their effects on navigation processor 330.

For example, in one embodiment, signal analyzer 320 further comprises a sub-channel selection/rejection function 322 that will analyze the sub-channel for the course signal and the sub-channel for the clearance signal, and reject the sub-channel for the clearance signal when its amplitude (i.e., received power level) falls below a predetermined threshold when compared to the course signal. For example, if a clearance signal is more than 10 dB down from the course signal, only the sub-channel with the course signal is passed to navigation processor 330. Embodiments of the present invention enable radio 300 to reject the clearance signal because signal analyzer 320 can individually look at difference sub-bands of the received pass band separately.

Figure 5:
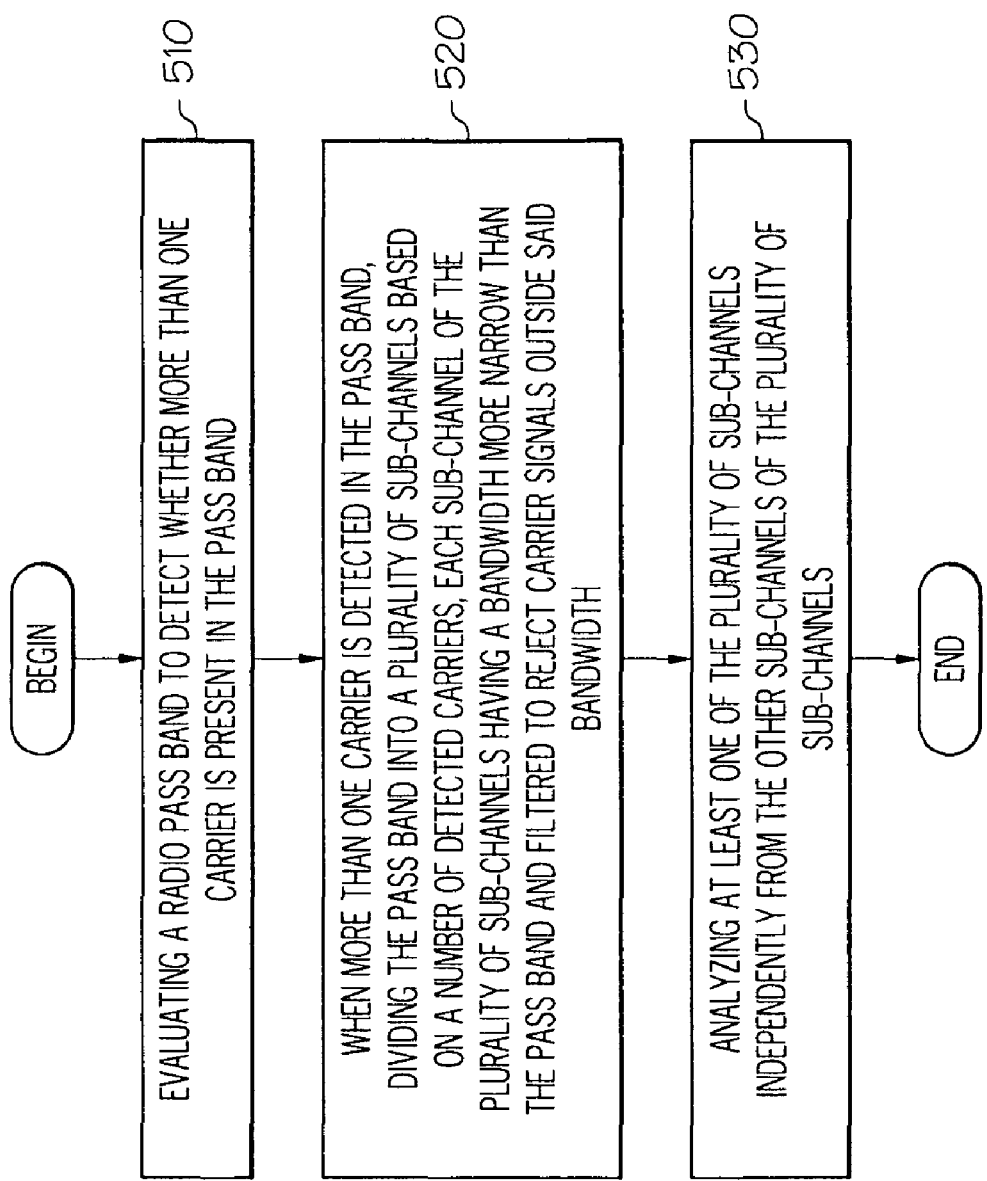
FIG. 5 is a flow chart illustrating a method of one embodiment of the present invention.

FIG. 5 is a flow chart illustrating a method of one embodiment of the present invention. As described above, embodiments of the present invention, by selectively and dynamically subdividing a pass band into a plurality of sub-channel allow for increased opportunities for individually analyzing signals compared to processing a pass band as a whole. The method begins at 510 with evaluating a radio pass band to detect whether more than one carrier is present in the pass band. When more than one carrier is detected in the pass band, the method proceeds to 520 with dividing the pass band into a plurality of sub-channels based on a number of detected carriers. As explained above, each sub-channel of the plurality of sub-channels has a bandwidth narrower than the pass band and a filter is applied to ensure rejection of carrier signals outside the bandwidth of the sub-channel. The method then proceeds to 530 with analyzing at least one of the plurality of sub-channels independently from the other sub-channels of the plurality of sub-channels. In one embodiment, a Fast Fourier Transform (FFT) is applied to identify where each of the sub-channels should be positioned within the pass band. In one embodiment, the pass band is divided into a number of sub-channels that is equal to the number of detected carriers.

The process described in FIG. 5 simplifies analysis of individual carriers within the pass band by separating them into distinct sub-channels that can be independently evaluated without interference caused by the presence of any other carriers within the pass band. For example, in one embodiment the analysis at block 530 may comprise identifying which of the sub-channels has the strongest carrier signal, and outputting just that particular sub-channel for further analysis, or for performing one or more functions such as operating a VHF radio squelch. Alternatively, the analysis at block 530 may comprise dividing the pass band so that navigation signals (such as ILS signals, for example) may be independently evaluated and selectively passed to a navigation processor. For example in one embodiment, the process may further comprise selectively outputting to a navigation processor a first sub-channel having a first navigation signal and second sub-channel having a second navigation signal based on a difference in power between the first navigation signal and the second navigation signal. Also as discussed above, the process of blocks 510 and 520 may be continuously performed to dynamically update both the number and position of sub-channels within the pass band based on, for example, changing signal strengths.

Several means are available to implement the systems and methods of the current invention as discussed in this specification. These means include, but are not limited to, analog filters, discrete analog circuitry and integrated circuits, as well as digital filters, digital computer systems, microprocessors, general purpose computers, programmable controllers and field programmable gate arrays. Therefore other embodiments of the present invention are program instructions resident on computer readable media which when implemented by such devices, enable the controllers to implement embodiments of the present invention. Computer readable media include any form of computer data storage device, including but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or temporary memory storage system or device. Program instructions include, but are not limited to computer-executable instructions executed by computer system processors and hardware description languages such as Very High Speed Integrated Circuit (VHSIC) Hardware Description Language (VHDL).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A radio receiver, the receiver comprising:
    an adaptive pass band filter that operates over a pass band of frequencies, the adaptive pass band filter subdividing the pass band into a plurality of sub-channels each comprising a narrower bandwidth than the pass band; and
    a signal analyzer receiving the plurality of sub-channels, the signal analyzer providing feedback to the adaptive pass band filter, wherein the adaptive pass band filter divides the pass band into the plurality of sub-channels based on the feedback;
    wherein the signal analyzer selectively generates an output comprising at least one of the plurality of sub-channels.

2. The radio receiver of claim 1, wherein the adaptive pass band filter determines a number of sub-channels for dividing the pass band and a position for each of the plurality of sub-channels within the pass band based on the feedback.

3. The radio receiver of claim 1, wherein the signal analyzer provides feedback to the adaptive pass band filter based on applying a Fourier transform to at least one of the plurality of sub-channels.

4. The radio receiver of claim 1, further comprising:
    a squelch control that operates a squelch based on the output of the signal analyzer.

5. The radio receiver of claim 1, wherein the signal analyzer generates the output based on selecting a first sub-channel of the plurality of channels having a strongest carrier signal.

6. The radio receiver of claim 1, further comprising:
    a navigation processor that generates navigation information based on the output of the signal analyzer.

7. The radio receiver of claim 6, wherein the adaptive pass band filter divides the pass band into a first sub-channel having a first navigation signal and second sub-channel having a second navigation signal.

8. The radio receiver of claim 6, wherein the signal analyzer selectively outputs to the navigation processor one or both of the first sub-channel and the second sub-channel based on a difference in power between the first navigation signal and the second navigation signal.

9. A signal processing circuit for evaluating multiple carriers within a radio pass band, the circuit comprising:
    an adaptive pass band filter that subdivides a radio pass band into a plurality of sub-channels;
    a signal analyzer implementing a Fourier transform function to analyze the plurality of sub-channels from the adaptive pass band filter, and implementing a sub-channel selection function to selectively generate an output comprising at least one of the plurality of sub-channels;
    wherein the adaptive pass band filter subdivides the radio pass band into the plurality of sub-channels based on feedback received from the signal analyzer.

10. The circuit of claim 9, wherein the signal analyzer causes the adaptive pass band filter to dynamically update a number and positions of the plurality of sub-channels based on a continuing analysis of signals within the radio pass band.

11. The circuit of claim 9, wherein the sub-channel selection function selectively outputs one or more of the plurality of sub-channels based on relative differences in carrier signal power levels between the plurality of sub-channels.

12. A method for processing multiple carrier communications and navigation signals, the method comprising:
    evaluating a radio pass band to detect whether more than one carrier is present in the pass band;
    when more than one carrier is detected in the pass band, dividing the pass band into a plurality of sub-channels based on a number of detected carriers, each sub-channel of the plurality of sub-channels having a bandwidth more narrow than the pass band and filtered to reject carrier signals outside said bandwidth; and
    analyzing at least one of the plurality of sub-channels independently from the other sub-channels of the plurality of sub-channels.

13. The method of claim 12, further comprising:
    applying a Fourier transform to identify a position within the pass band for each sub-channel.

14. The method of claim 12, wherein dividing the pass band into a plurality of sub-channels based on a number of detected carriers further comprises dividing the pass band into a number of sub-channels equal to the number of detected carriers.

15. The method of claim 12, wherein analyzing at least one of the plurality of sub-channels independently from the other sub-channels of the plurality of sub-channels further comprises:
   selecting a first sub-channel of the plurality of channels having a strongest carrier signal; and
   outputting the first sub-channel.

16. The method of claim 15, further comprising actuating a radio squelch based on the first sub-channel.

17. The method of claim 12, wherein analyzing at least one of the plurality of sub-channels independently from the other sub-channels of the plurality of sub-channels further comprises:
   selectively outputting to a navigation processor a first sub-channel having a first navigation signal and second sub-channel having a second navigation signal based on a difference in power between the first navigation signal and the second navigation signal.

18. The method of claim 17, wherein the first navigation signal is a course signal and the second navigation signal is a clearance signal.

19. The method of claim 17, wherein the first navigation signal and the second navigation signal are Instrument Landing System (ILS) localizer signals.

20. The method of claim 12, wherein dividing the pass band into a plurality of sub-channels based on a number of detected carriers further comprises dynamically updating the plurality of sub-channels based on evaluation of the radio pass band.

* * * * *